(12) United States Patent
Kawarazaki et al.

(10) Patent No.: US 11,430,676 B2
(45) Date of Patent: Aug. 30, 2022

(54) HEAT TREATMENT METHOD OF LIGHT IRRADIATION TYPE

(71) Applicant: SCREEN Holdings Co., Ltd., Kyoto (JP)

(72) Inventors: Hikaru Kawarazaki, Kyoto (JP); Yoshihide Nozaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 112 days.

(21) Appl. No.: 16/901,217

(22) Filed: Jun. 15, 2020

(65) Prior Publication Data
US 2021/0043477 A1 Feb. 11, 2021

(30) Foreign Application Priority Data

Aug. 7, 2019 (JP) .............................. JP2019-145205

(51) Int. Cl.
*H01L 21/324* (2006.01)
*H01L 21/66* (2006.01)
*H01L 21/67* (2006.01)

(52) U.S. Cl.
CPC .. *H01L 21/67115* (2013.01); *H01L 21/67248* (2013.01); *H01L 22/12* (2013.01); *H01L 22/20* (2013.01)

(58) Field of Classification Search
CPC ......... H01L 21/67115; H01L 21/67248; H01L 22/12; H01L 22/20; H01L 21/324; G01J 5/0007
See application file for complete search history.

(56) References Cited

U.S. PATENT DOCUMENTS

| 6,072,164 A | 6/2000 | Tate et al. ..................... 219/497 |
| 10,643,869 B2 * | 5/2020 | Kitazawa .......... H01L 21/67248 |

(Continued)

FOREIGN PATENT DOCUMENTS

| JP | 63-305228 A | 12/1988 |
| JP | 9-246200 A | 9/1997 |

(Continued)

OTHER PUBLICATIONS

Office Action and Search Report dated Jul. 20, 2021 in corresponding Taiwanese Patent Application No. 109118398 with English translation of Search Report.

(Continued)

*Primary Examiner* — Mary A Wilczewski
(74) *Attorney, Agent, or Firm* — Ostrolenk Faber LLP

(57) ABSTRACT

A semiconductor wafer is heated by a flash of light emitted from a flash lamp after being preheated by a halogen lamp. Temperature of the semiconductor wafer immediately before the flash of light is emitted is measured by a lower radiation thermometer. At the time of irradiation with a flash of light, an upper radiation thermometer measures temperature increase of a front surface of the semiconductor wafer. Front surface temperature of the semiconductor wafer is calculated by adding the temperature increase of the front surface of the semiconductor wafer at the time of irradiation with a flash of light measured by the upper radiation thermometer to the back surface temperature of the semiconductor wafer measured by the lower radiation thermometer.

2 Claims, 10 Drawing Sheets

(56) References Cited

U.S. PATENT DOCUMENTS

| | | | |
|---|---|---|---|
| 10,998,206 B2* | 5/2021 | Ono | H01J 61/16 |
| 2012/0244725 A1* | 9/2012 | Fuse | H01L 21/2686 438/799 |
| 2012/0288261 A1 | 11/2012 | Hashimoto et al. | 392/416 |
| 2012/0288970 A1 | 11/2012 | Hashimoto et al. | 438/16 |
| 2018/0240689 A1* | 8/2018 | Kitazawa | H01L 21/67115 |
| 2018/0269085 A1 | 9/2018 | Fuse et al. | |
| 2019/0157168 A1* | 5/2019 | Kawarazaki | H01L 21/67115 |
| 2019/0393054 A1* | 12/2019 | Ono | H01L 22/20 |
| 2020/0381273 A1* | 12/2020 | Shigemasu | H01L 21/67248 |
| 2021/0020472 A1* | 1/2021 | Omori | H01L 22/12 |
| 2021/0043477 A1* | 2/2021 | Kawarazaki | H01L 22/12 |
| 2021/0159111 A1* | 5/2021 | Prengle | H01L 21/67248 |
| 2022/0037164 A1* | 2/2022 | Omori | H01L 21/2686 |

FOREIGN PATENT DOCUMENTS

| | | | | |
|---|---|---|---|---|
| JP | 2009-231694 | * | 10/2009 | H01L 21/26 |
| JP | 2010-38562 | * | 2/2010 | G01J 5/00 |
| JP | 2010-225613 | * | 10/2010 | H01L 21/26 |
| JP | 2012-238779 A | | 12/2012 | |
| JP | 2012-238782 A | | 12/2012 | |
| JP | 2018-157064 A | | 10/2018 | |
| JP | 2021-101444 | * | 7/2021 | H01L 21/26 |
| KR | 10-2018-0106862 A | | 10/2018 | |
| TW | 201836014 A | | 10/2018 | |
| TW | 201923848 A | | 6/2019 | |
| WO | WO 2021/131276 | * | 7/2021 | H01L 21/26 |

OTHER PUBLICATIONS

Notification of Reason for Refusal dated Dec. 9, 2021 in counterpart Korean Patent Application No. 10-2020-0097251 with English translation obtained from One Portal Dossier.

Notice of Final Rejection dated May 30, 2022 in counterpart Korean Patent Application No. 10-2020-0097251 and English translation obtained from One Portal Dossier.

* cited by examiner

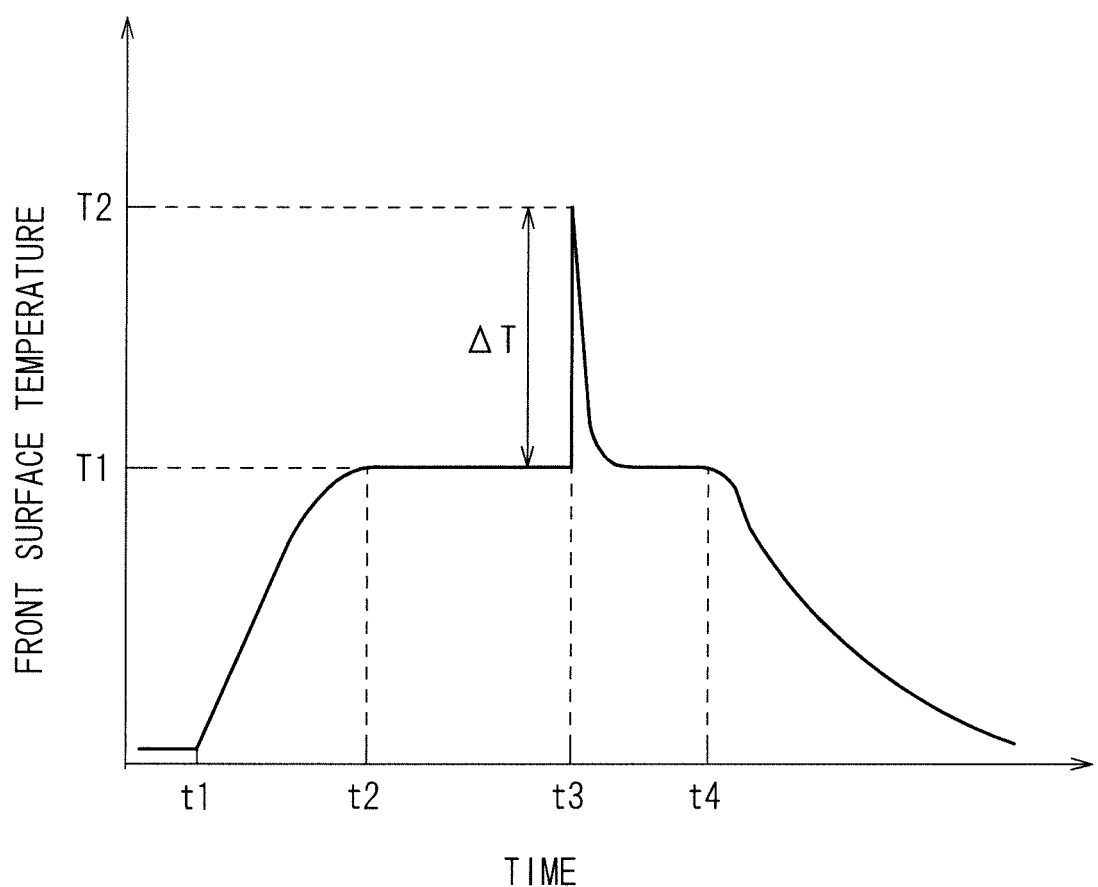
F I G. 1 1

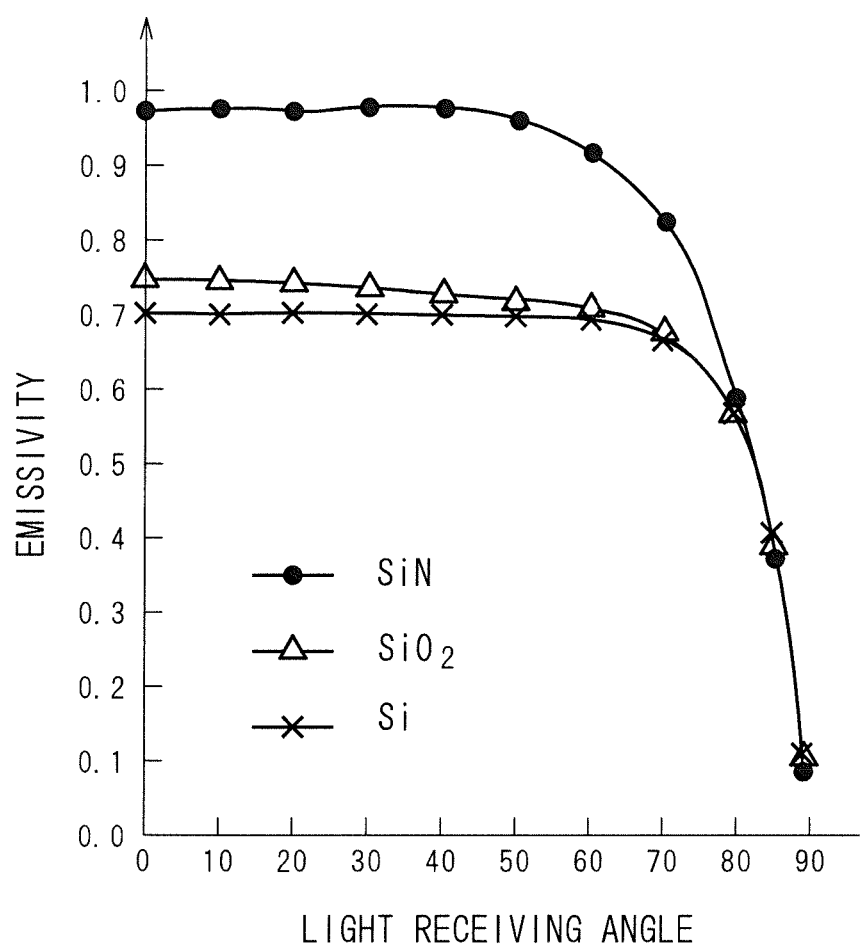
F I G. 1 2

HEAT TREATMENT METHOD OF LIGHT IRRADIATION TYPE

BACKGROUND OF THE INVENTION

Field of the Invention

The present invention relates to a heat treatment method for irradiating a thin plated precision electronic substrate (hereinafter referred to simply as a "substrate"), such as a semiconductor wafer having a back surface formed with a film, with a flash of light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a front surface of a semiconductor wafer with a flash of light, thereby raising the temperature of only the front surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. In addition, it has turned out that flash irradiation, that is, the irradiation of a semiconductor wafer with a flash of light in an extremely short time of several milliseconds or less allows a selective temperature increase only near the front surface of the semiconductor wafer.

This kind of flash lamp annealing is used for treatment requiring heating for an extremely short time, such as typically activation of impurities implanted into a semiconductor wafer. The irradiation of a front surface of a semiconductor wafer implanted with impurities by an ion implantation process with a flash of light emitted from flash lamps allows the temperature increase only in the front surface of the semiconductor wafer to an activation temperature for an extremely short time. This enables achieving only the activation of the impurities without deep diffusion of the impurities.

Besides the flash lamp annealing, control of wafer temperature is important in heat treatment of a semiconductor wafer. US 2012/0288970 and US 2012/0288261 each disclose a technique in which radiation thermometers are provided obliquely above and below a semiconductor wafer to be treated and the radiation thermometers receive radiation light emitted from a main surface of the semiconductor wafer to measure temperature of the main surface.

Unfortunately, when a flash of light is emitted for an extremely short period of time, the semiconductor wafer has front surface temperature changing rapidly in sub-millisecond units, and thus it is difficult to accurately measure the front surface temperature. In addition, a more complicated process of manufacturing a semiconductor requires deposition treatment on a semiconductor wafer to be subjected to flash lamp annealing in many cases. While measuring temperature of a semiconductor wafer with a radiation thermometer requires emissivity of an object to be measured, the semiconductor wafer formed with a film has emissivity that changes from that of a wafer base material. This causes temperature measurement to be more difficult.

SUMMARY OF THE INVENTION

The present invention is intended for a heat treatment method for heating a substrate having a back surface formed with a film by irradiating the substrate with a flash of light.

In an aspect of the present invention, the heat treatment method includes the following steps: (a) preheating the substrate by irradiating the substrate with light from a continuous lighting lamp; (b) irradiating a front surface of the preheated substrate with a flash of light from a flash lamp to heat the substrate by flash heating; (c) measuring continuously temperature of the back surface of the substrate with a first radiation thermometer provided obliquely below the substrate when the step (a) and the step (b) are performed; (d) measuring a temperature increase of the front surface of the substrate at the time of irradiation with a flash of light with a second radiation thermometer provided obliquely above the substrate when the step (b) is performed; and (e) calculating front surface temperature of the substrate by adding the temperature increase of the front surface of the substrate at the time of irradiation with a flash of light measured with the second radiation thermometer to the temperature of the back surface of the substrate measured with the first radiation thermometer during a period of time from when the preheated substrate has a temperature reaching a predetermined temperature to when the flash of light is emitted.

This enables accurate measurement of front surface temperature of a substrate at the time of irradiation with a flash of light.

The first radiation thermometer preferably has a light receiving angle of 60° or more and 89° or less with respect to the substrate.

This enables more accurate measurement of front surface temperature of a substrate at the time of irradiation with a flash of light by measuring accurately temperature of the back surface of the substrate with the first radiation thermometer regardless of a type of film on the back surface.

Thus, it is an object of the present invention to measure accurately front surface temperature of a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a graph showing change in front surface temperature of a semiconductor wafer; and FIG. 12 is a graph showing influence of a formed film on emissivity.

DESCRIPTION OF THE PREFERRED EMBODIMENTS

Hereinafter, preferred embodiments according to the present invention will be described in detail with reference to the drawings.

Figure 1:
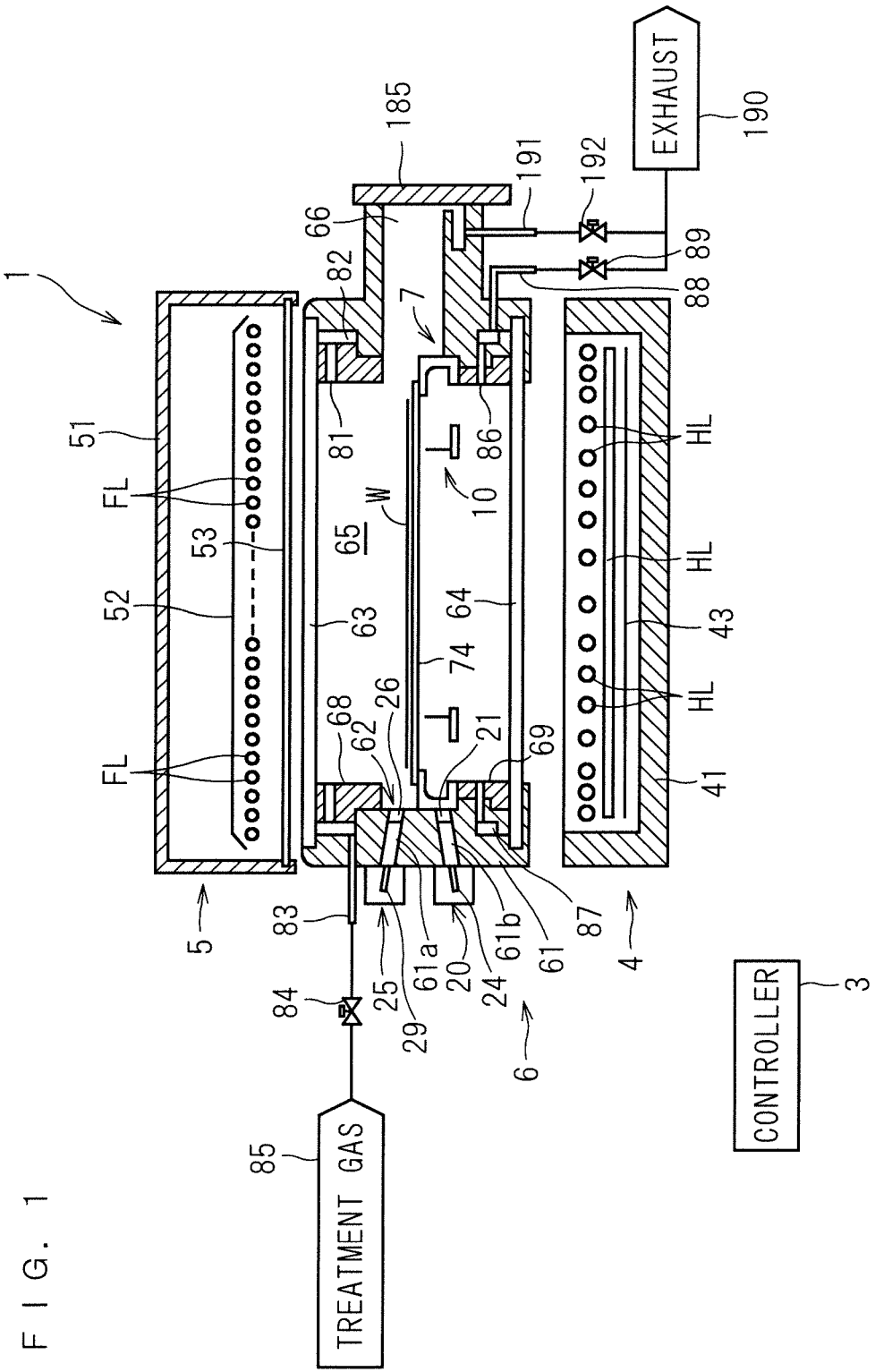
FIG. 1 is a longitudinal sectional view illustrating a configuration of a heat treatment apparatus for performing a heat treatment method according to the present invention.

FIG. 1 is a longitudinal sectional view illustrating a configuration of a heat treatment apparatus 1 for performing a heat treatment method according to the present invention. The heat treatment apparatus 1 of FIG. 1 is a flash lamp annealer for irradiating a disk-shaped semiconductor wafer W serving as a substrate with flashes of light to heat the semiconductor wafer W. While a size of the semiconductor wafer W to be treated is not particularly limited, the semiconductor wafer W to be treated has a diameter of 300 mm or 450 mm, for example (300 mm in the present preferred embodiment). FIG. 1 and the subsequent drawings show dimensions of components and the number of components in an exaggerated manner or in a simplified manner as needed to facilitate understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal orientation, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that each chamber window made of quartz is mounted to the top and bottom of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. The upper and lower reflective rings 68 and 69 are each formed in the shape of an annular ring. The upper reflective ring 68 is mounted by being inserted downwardly from above the chamber side portion 61. The lower reflective ring 69, on the other hand, is mounted by being inserted upwardly from below the chamber side portion 61 and fastened with screws (not illustrated). In other words, the upper and lower reflective rings 68 and 69 are mounted to the chamber side portion 61 in a detachable manner. An interior space of the chamber 6, i.e. a space surrounded by the upper chamber window 63, the lower chamber window 64, the chamber side portion 61, and the reflective rings 68 and 69, is defined as a heat treatment space 65.

A recessed portion 62 is defined in the inner wall surface of the chamber 6 by mounting the reflective rings 68 and 69 to the chamber side portion 61. Specifically, there is defined the recessed portion 62 surrounded by a middle portion of the inner wall surface of the chamber side portion 61 where the reflective rings 68 and 69 are not mounted, a lower end surface of the reflective ring 68, and an upper end surface of the reflective ring 69. The recessed portion 62 is formed in the shape of a horizontal annular ring in the inner wall surface of the chamber 6, and surrounds the holder 7 holding a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable by a gate valve 185. The transport opening 66 is connected in communication with an outer peripheral surface of the recessed portion 62. Thus, when the transport opening 66 is opened by the gate valve 185, a semiconductor wafer W is allowed to be transported from the transport opening 66 through the recessed portion 62 into the heat treatment space 65 and transported out of the heat treatment space 65. When the transport opening 66 is closed by the gate valve 185, the heat treatment space 65 in the chamber 6 is an enclosed space.

The chamber side portion 61 is further provided with through holes 61a and 61b bored therein. The through hole 61a is a cylindrical hole for guiding infrared light to an infrared sensor 29 of an upper radiation thermometer 25 (second radiation thermometer), the infrared light being emitted from an upper surface of a semiconductor wafer W held by a susceptor 74 described later. On the other hand, the through hole 61b is a cylindrical hole for guiding infrared light emitted from a lower surface of a semiconductor wafer W to an infrared sensor 24 of a lower radiation thermometer 20 (first radiation thermometer). The through holes 61a and 61b are each provided inclined from a horizontal direction, and each has an axis in its penetrating direction intersecting a main surface of a semiconductor wafer W held by the susceptor 74. The through hole 61a is provided at its end facing the heat treatment space 65 with a transparent window 26 made of a calcium fluoride material that allows infrared light in a wavelength range measurable by the upper radiation thermometer 25 to pass therethrough. In addition, the through hole 61b is provided at its end facing the heat treatment space 65 with a transparent window 21 made of a barium fluoride material that allows infrared light in a wavelength range measurable by the lower radiation thermometer 20 to pass therethrough.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the reflective ring 68. The gas supply opening 81 is connected in communication with a gas supply pipe 83 through a buffer space 82 formed in the shape of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing into the buffer space 82 flows in a spreading manner within the buffer space 82 that is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in the present preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 formed in the shape of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The pluralities of gas supply opening 81 and gas exhaust opening 86 may be provided in a circumferential direction of the chamber 6, and each may be in the shape of a slit. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. When the valve 192 is opened, the gas in the chamber 6 is exhausted through the transport opening 66.

Figure 2:
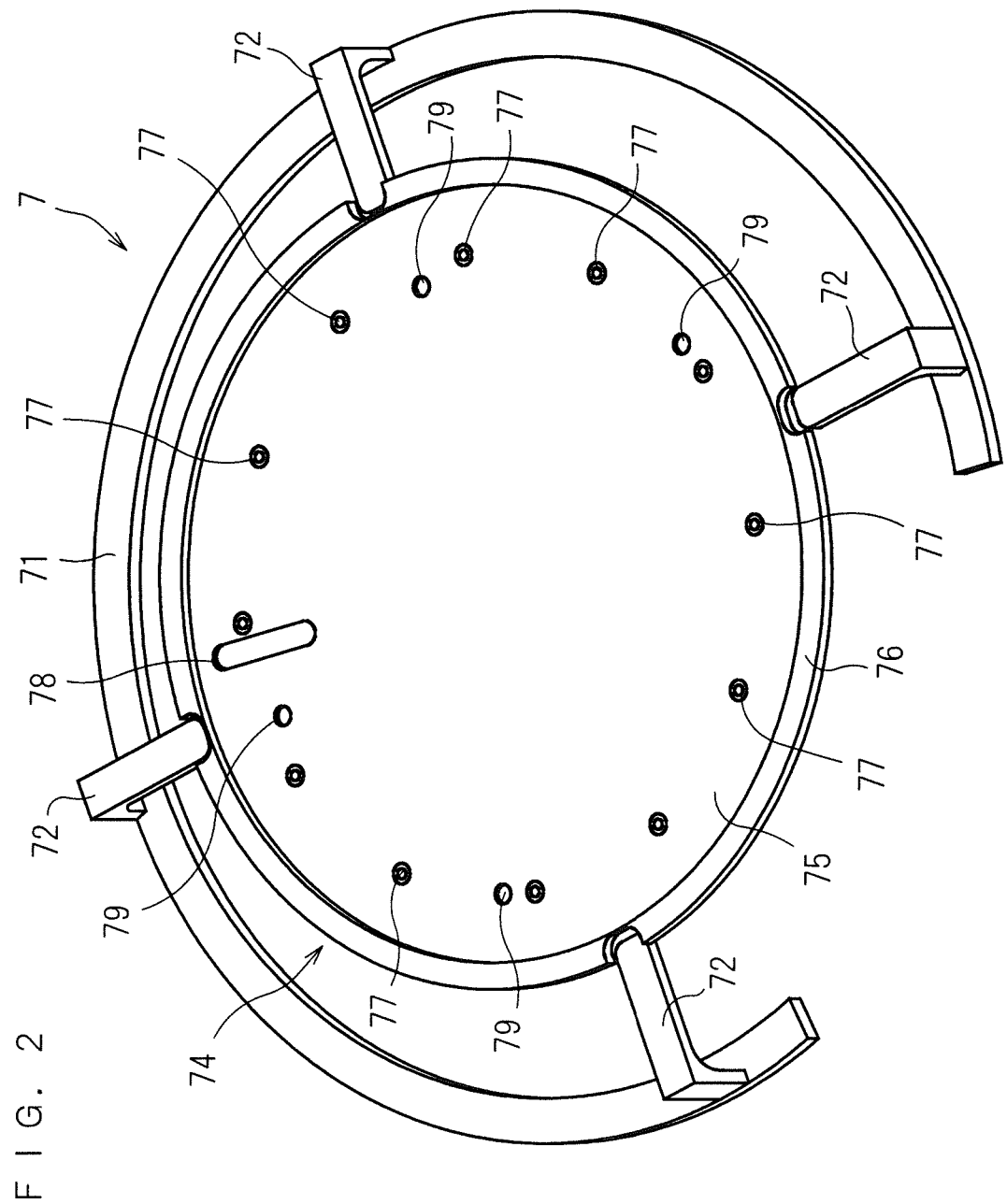
FIG. 2 is a perspective view illustrating the entire external appearance of a holder.

FIG. 2 is a perspective view illustrating the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (refer to FIG. 1). The multiple coupling portions 72 (four coupling portions in the present preferred embodiment) are provided upright on the upper surface of the base ring 71 in a circumferential direction of the annular shape of the base ring 71. The coupling portions 72 are each a quartz member, and are each rigidly secured to the base ring 71 by welding.

Figure 3:
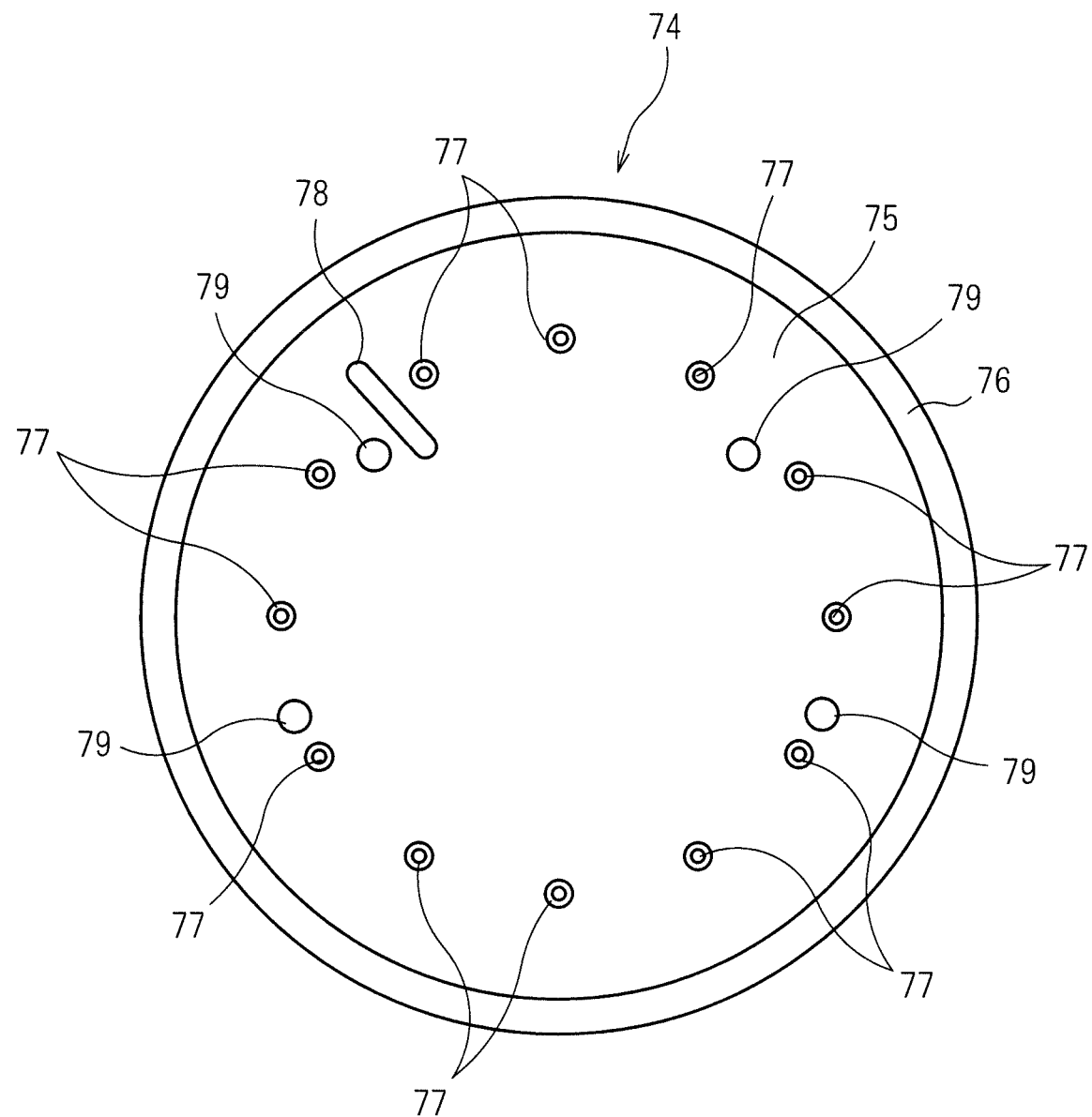
FIG. 3 is a plan view of a susceptor.
Figure 4:
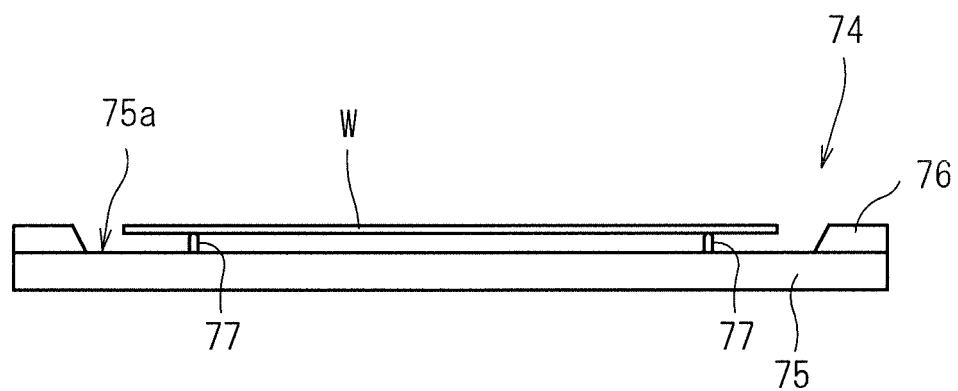
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a substantially circular planar member made of quartz. The holding plate 75 has a diameter greater than that of a semiconductor wafer W. In other words, the holding plate 75 has a planar size greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the semiconductor wafer W has a diameter of 300 mm, the guide ring 76 has an inner diameter of 320 mm. The guide ring 76 has an inner periphery formed in a tapered surface increasing in diameter upward from the holding plate 75. The guide ring 76 is made of quartz similar to that of the holding plate 75. The guide ring 76 may be welded to the upper surface of the holding plate 75, or fixed to the holding plate 75 with pins separately machined or the like. Alternatively, the holding plate 75 and the guide ring 76 may be machined as an integral member.

The upper surface of the holding plate 75 includes a region inside the guide ring 76, serving as a planar holding surface 75a for holding the semiconductor wafer W. The plurality of substrate support pins 77 are provided upright on the holding surface 75a of the holding plate 75. In the present preferred embodiment, a total of 12 substrate support pins 77 are provided upright every 30 degrees along the circumference of a circle concentric with the outer circumference of the holding surface 75a (the inner circumference of the guide ring 76). The 12 substrate support pins 77 are disposed on a circle that has a diameter (a distance between the substrate support pins 77 facing each other) smaller than a diameter of the semiconductor wafer W, and that has a diameter of 270 mm to 280 mm (270 mm in the present preferred embodiment) when the semiconductor wafer W has a diameter of 300 mm. Each of the substrate support pins 77 is made of quartz. The plurality of substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. When the base ring 71 of the holder 7 as described above is supported by the wall surface of the chamber 6, the holder 7 is mounted to the chamber 6. The holder 7 mounted to the chamber 6 causes the holding plate 75 of the susceptor 74 to be a horizontal orientation (an orientation in which the normal line to the holding plate 75 coincides with a vertical direction). In other words, the holding surface 75a of the holding plate 75 is horizontal.

A semiconductor wafer W transported into the chamber 6 is placed and held in a horizontal orientation on the susceptor 74 of the holder 7 mounted to the chamber 6. At this time, the semiconductor wafer W is supported by the 12 substrate support pins 77 provided upright on the holding plate 75, and is held by the susceptor 74. More specifically, the 12 substrate support pins 77 have respective upper end portions that come into contact with the lower surface of the semiconductor wafer W to support the semiconductor wafer W. The 12 substrate support pins 77 are uniform in height (distance from an upper end of each of the substrate support pins 77 to the holding surface 75a of the holding plate 75), so that the semiconductor wafer W can be supported in a horizontal orientation by the 12 substrate support pins 77.

The semiconductor wafer W is supported by the plurality of substrate support pins 77 at a predetermined interval from the holding surface 75a of the holding plate 75. The guide ring 76 has a thickness greater than a height of each of the substrate support pins 77. Thus, the guide ring 76 prevents the semiconductor wafer W supported by the substrate support pins 77 from being displaced horizontally.

As illustrated in FIGS. 2 and 3, the holding plate 75 of the susceptor 74 is formed with an opening 78 extending vertically through the holding plate 75. The opening 78 is provided for the lower radiation thermometer 20 to receive radiation (infrared radiation) emitted from the lower surface of the semiconductor wafer W. Specifically, the lower radiation thermometer 20 receives light emitted from the lower surface of the semiconductor wafer W through the opening 78 and the transparent window 21 mounted to the through hole 61b in the chamber side portion 61 to measure temperature of the semiconductor wafer W. The holding plate 75 of the susceptor 74 further includes four through holes 79 bored therein through which respective lift pins 12 of the transfer mechanism 10, described later, pass to transfer a semiconductor wafer W.

Figure 5:
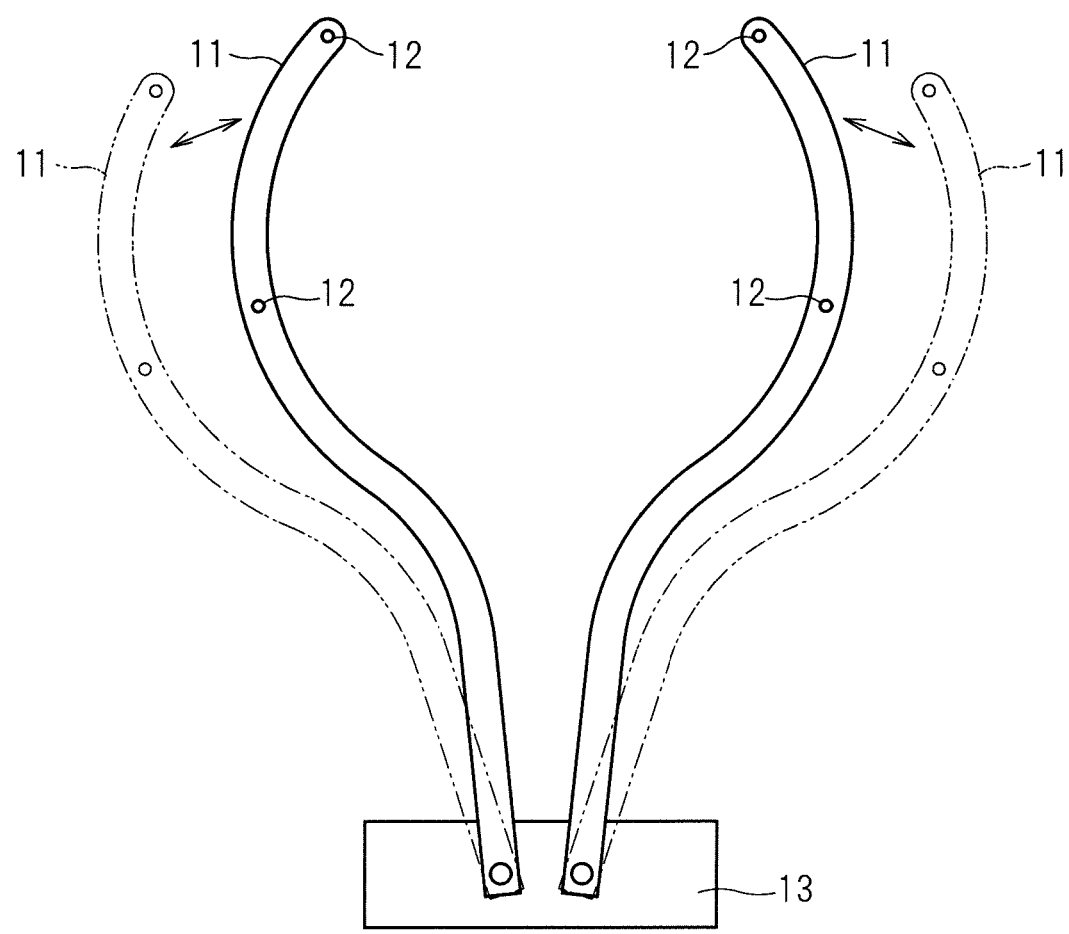
FIG. 5 is a plan view of a transfer mechanism.
Figure 6:
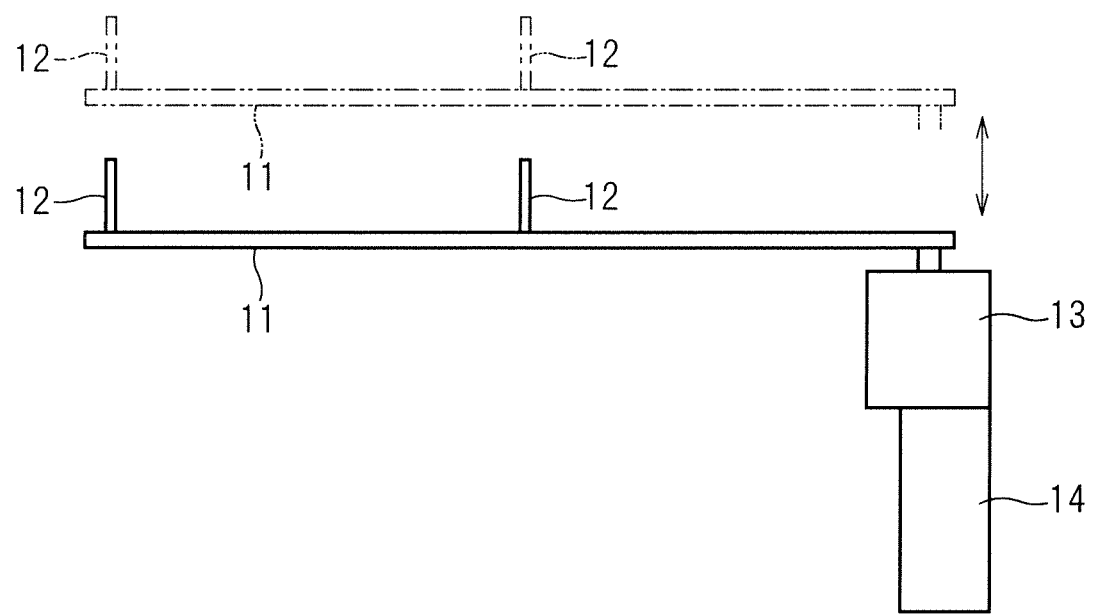
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are each in an arcuate shape substantially along the recessed portion 62 in an annular shape. Each of the transfer arms 11 includes the two lift pins 12 provided upright thereon. The transfer arms 11 and the lift pins 12 are each made of quartz. The transfer arms 11 are each pivotable by a horizontal movement mechanism 13. The horizontal movement mechanism 13 moves the pair of transfer arms 11 horizontally between a transfer operation position (a position indicated with solid lines in FIG. 5) in which a semiconductor wafer W is transferred to and from the holder 7 and a retracted position (a position indicated with dash-double-dot lines in FIG. 5) in which the transfer arms 11 do not overlap the semiconductor wafer W held by the holder 7 in plan view. The horizontal movement mechanism 13 may be configured such that individual motors cause the respective transfer arms 11 to pivot, or may be configured such that a single motor causes the pair of transfer arms 11 to pivot in a linked manner using a linkage mechanism.

The transfer arms 11 are moved upwardly and downwardly together with the horizontal movement mechanism 13 by an elevating mechanism 14. When the elevating mechanism 14 moves up the pair of transfer arms 11 at their transfer operation positions, the four lift pins 12 in total pass through the respective four through holes 79 (refer to FIGS. 2 and 3) bored in the susceptor 74. This allows upper ends of the lift pins 12 to protrude from the upper surface of the susceptor 74. On the other hand, when the elevating mechanism 14 moves down the pair of transfer arms 11 at their transfer operation positions to take the lift pins 12 out of the respective through holes 79 and the horizontal movement mechanism 13 moves the pair of transfer arms 11 so as to open the transfer arms 11, the transfer arms 11 are moved to their retracted positions. The retracted positions of the pair of transfer arms 11 are immediately over the base ring 71 of the holder 7. The retracted positions of the transfer arms 11 are inside the recessed portion 62 because the base ring 71 is placed on the bottom surface of the recessed portion 62. The transfer mechanism 10 includes an exhaust mechanism (not illustrated) that is provided also near portions where drivers (the horizontal movement mechanism 13 and the elevating mechanism 14) are provided so that an atmosphere around the drivers of the transfer mechanism 10 is exhausted to the outside of the chamber 6.

Referring again to FIG. 1, the flash heating part 5 provided over the chamber 6 includes an enclosure 51, a light source provided inside the enclosure 51 and including the multiple (30 in the present preferred embodiment) xenon flash lamps FL, and a reflector 52 provided inside the enclosure 51, covering the light source from above. The flash heating part 5 further includes a lamp light radiation window 53 mounted to the bottom of the enclosure 51. The lamp light radiation window 53 constituting the floor of the flash heating part 5 is a plate-like quartz window made of quartz. When the flash heating part 5 is provided over the chamber 6, the lamp light radiation window 53 faces the upper chamber window 63. The flash lamps FL emit a flash of light from over the chamber 6 through the lamp light radiation window 53 and the upper chamber window 63 into the heat treatment space 65.

The multiple flash lamps FL, each of which is a rod-shaped lamp having an elongated cylindrical shape, are arranged in a plane so that the longitudinal directions of the respective flash lamps FL are parallel to each other along a main surface of a semiconductor wafer W held by the holder 7 (i.e., in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. The xenon gas is electrically insulative, so that no current flows in the glass tube in a normal state even when electrical charge is accumulated in the capacitor. However, when a high voltage is applied to the trigger electrode to produce a dielectric breakdown, electricity accumulated in the capacitor flows momentarily in the glass tube, and xenon atoms or molecules are excited at this time to cause light emission. Such a xenon flash lamp FL has the property of being capable of emitting extremely intense light as compared with a light source for continuous lighting such as a halogen lamp HL because the electrostatic energy preliminarily accumulated in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source that supplies power to the flash lamps FL.

The reflector 52 is provided over the plurality of flash lamps FL, covering all of the flash lamps FL. The reflector 52 has a fundamental function of reflecting a flash of light emitted from the plurality of flash lamps FL toward the heat treatment space 65. The reflector 52 is formed of an aluminum-alloy plate, and has a front surface (a surface facing the flash lamps FL) that is roughened by blasting.

The halogen heating part 4 provided under the chamber 6 includes an enclosure 41 incorporating the multiple (40 in the present preferred embodiment) halogen lamps HL. The halogen heating part 4 heats the semiconductor wafer W by emitting light from under the chamber 6 through the lower chamber window 64 into the heat treatment space 65 using the halogen lamps HL.

Figure 7:
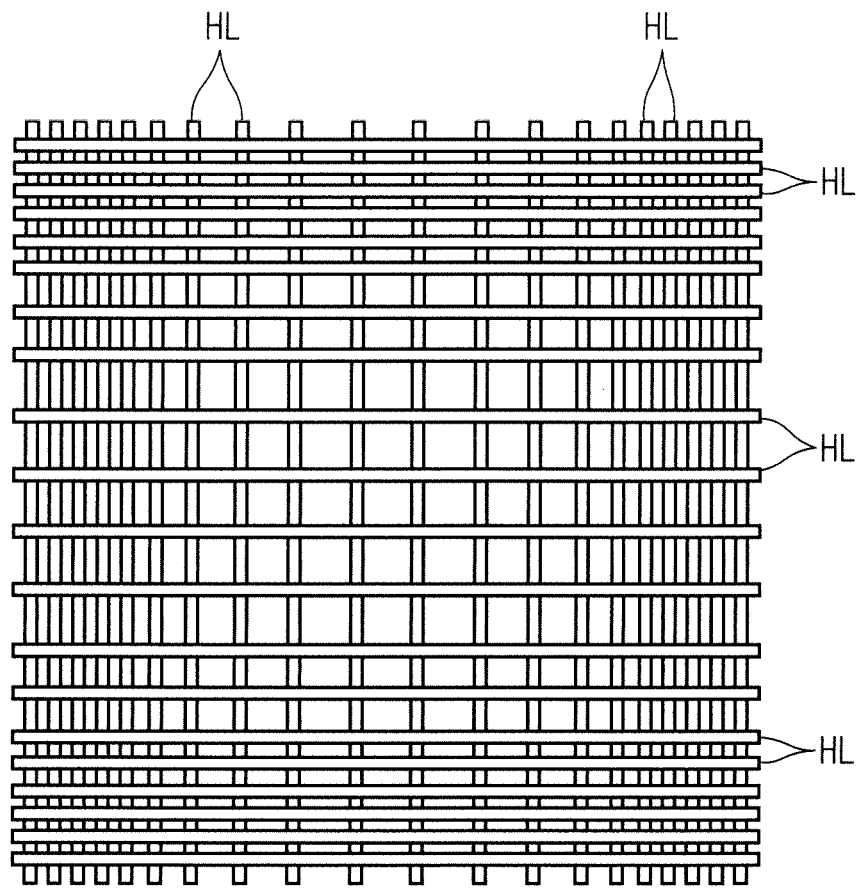
FIG. 7 is a plan view illustrating an arrangement of a plurality of halogen lamps.

FIG. 7 is a plan view illustrating an arrangement of the multiple halogen lamps HL. The 40 halogen lamps HL are arranged in two tiers, i.e., upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are parallel to each other along a main surface of a semiconductor wafer W held by the holder 7 (i.e., in a horizontal direction). Thus, a plane defined by the arrangement of the halogen lamps HL in each of the upper and lower tiers is also a horizontal plane.

As illustrated in FIG. 7, the halogen lamps HL in each of the upper and lower tiers are disposed at a higher density in a region facing a peripheral portion of the semiconductor wafer W held by the holder 7 than in a region facing a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated using light emitted from the halogen heating part 4.

The group of halogen lamps HL in the upper tier and the group of halogen lamps HL in the lower tier are arranged intersecting each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least one second or more. In addition, the halogen lamps HL are rod-shaped lamps and thus have a long life. The arrangement of the halogen lamps HL in a horizontal direction provides good efficiency of radiation toward the semiconductor wafer W provided over the halogen lamps HL.

The enclosure 41 of the halogen heating part 4 is also provided inside with a reflector 43 under the halogen lamps HL arranged in two tiers (FIG. 1). The reflector 43 reflects the light emitted from the halogen lamps HL toward the heat treatment space 65.

Figure 8:
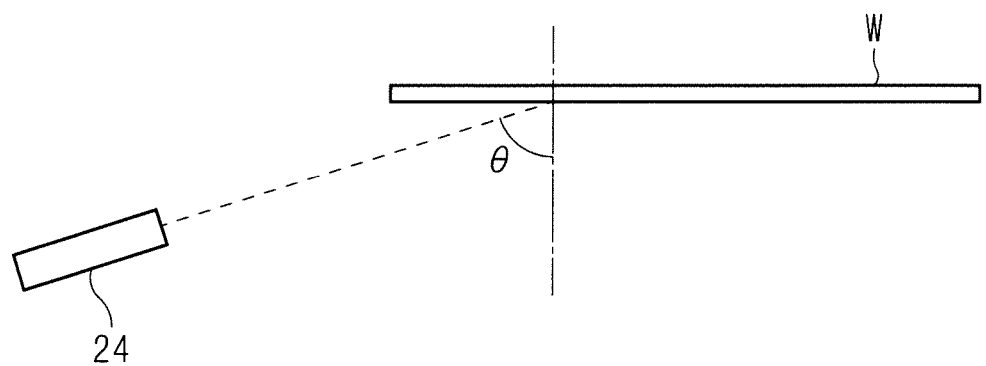
FIG. 8 is a view illustrating a positional relationship between a lower radiation thermometer and a semiconductor wafer held by a susceptor.

As illustrated in FIG. 1, the chamber 6 is provided with two radiation thermometers (pyrometers in the present preferred embodiment) of the upper radiation thermometer 25 and the lower radiation thermometer 20. The upper radiation thermometer 25 is provided obliquely above the semiconductor wafer W held by the susceptor 74, and the lower radiation thermometer 20 is provided obliquely below the semiconductor wafer W held by the susceptor 74. FIG. 8 is a view illustrating a positional relationship between the lower radiation thermometer 20 and the semiconductor wafer W held by the susceptor 74. The infrared sensor 24 of the lower radiation thermometer 20 has a light receiving angle θ of 60° or more and 89° or less with respect to the semiconductor wafer W. The light receiving angle θ is formed between the optical axis of the infrared sensor 24 of the lower radiation thermometer 20 and the normal line (a line perpendicular to the main surface) of the semiconductor wafer W. Similarly, the infrared sensor 29 of the upper radiation thermometer 25 also has a light receiving angle of 60° or more and 89° or less with respect to the semiconductor wafer W.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

Figure 9:
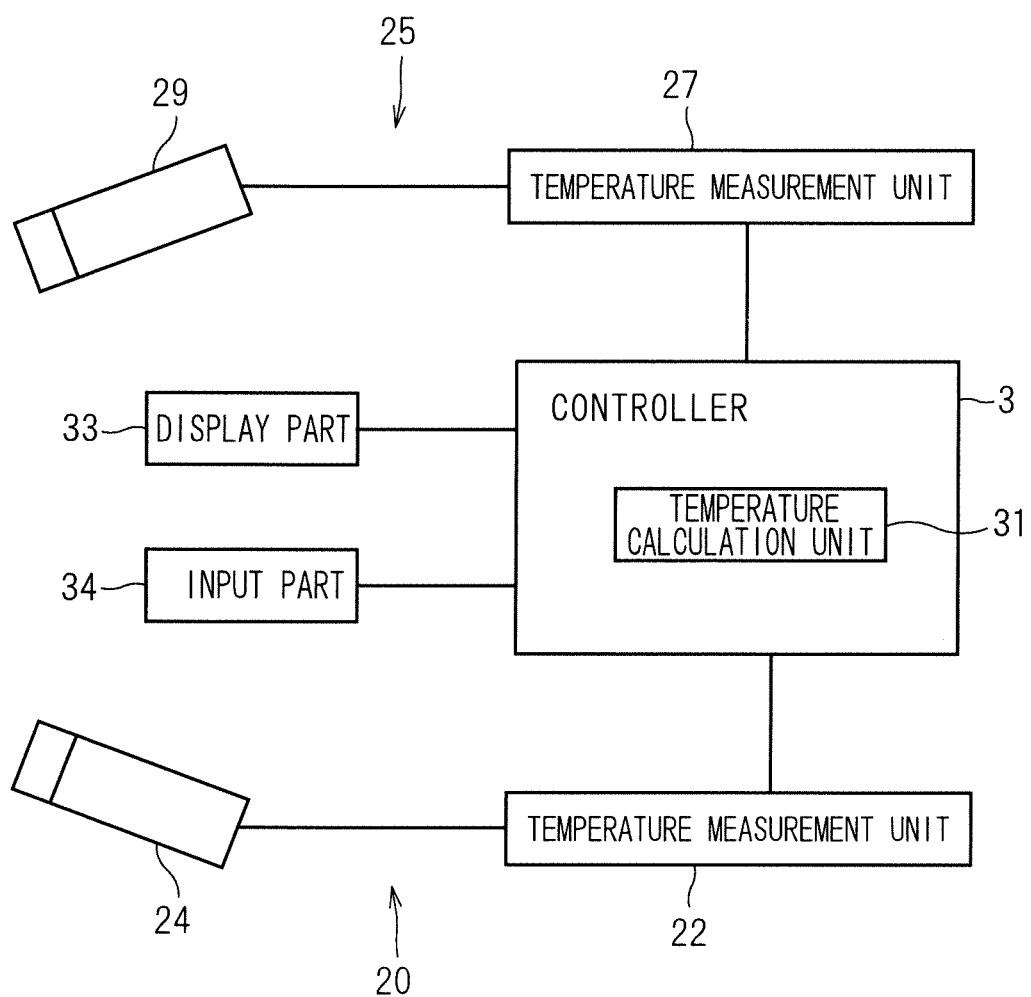
FIG. 9 is a functional block diagram of a lower radiation thermometer, an upper radiation thermometer, and a controller.

FIG. 9 is a functional block diagram of the lower radiation thermometer 20, the upper radiation thermometer 25, and the controller 3. The lower radiation thermometer 20 provided obliquely below the semiconductor wafer W to measure temperature of the lower surface of the semiconductor wafer W includes the infrared sensor 24 and a temperature measurement unit 22. The infrared sensor 24 receives infrared light emitted from the lower surface of the semiconductor wafer W held by the susceptor 74 through the opening 78. The infrared sensor 24 is electrically connected to the temperature measurement unit 22 to transmit a signal, generated in response to receiving of light, to the temperature measurement unit 22. The temperature measurement unit 22 includes an amplification circuit, an A/D converter, a temperature conversion circuit, and the like, which are not illustrated, and converts a signal indicating intensity of infrared light output from the infrared sensor 24 into temperature. The temperature obtained by the temperature measurement unit 22 is temperature of the lower surface of the semiconductor wafer W.

On the other hand, the upper radiation thermometer 25 provided obliquely above the semiconductor wafer W to measure temperature of the upper surface of the semiconductor wafer W includes the infrared sensor 29 and a temperature measurement unit 27. The infrared sensor 29 receives infrared light emitted from the upper surface of the semiconductor wafer W held by the susceptor 74. The infrared sensor 29 includes an optical element of indium antimony (InSb) to be able to respond to a rapid temperature change on the upper surface of the semiconductor wafer W at the moment when the upper surface is irradiated with a flash of light. The infrared sensor 29 is electrically connected to the temperature measurement unit 27 to transmit a signal, generated in response to receiving of light, to the temperature measurement unit 27. The temperature measurement unit 27 converts the signal indicating intensity of the infrared light output from the infrared sensor 29 into temperature. The temperature obtained by the temperature measurement unit 27 is temperature of the upper surface of the semiconductor wafer W.

The lower radiation thermometer 20 and the upper radiation thermometer 25 are electrically connected to the controller 3 that is a controller of the entire heat treatment apparatus 1, and the temperatures of the lower surface and the upper surface of the semiconductor wafer W measured by the lower radiation thermometer 20 and the upper radiation thermometer 25, respectively, are transmitted to the controller 3. The controller 3 includes a temperature calculation unit 31. The temperature calculation unit 31 is a function processing unit that serves when the CPU of the controller 3 executes a predetermined processing program. Processing contents of the temperature calculation unit 31 will be described later.

The controller 3 is connected to a display part 33 and an input part 34. The controller 3 causes the display part 33 to display a variety of pieces of information. The input part 34 allows an operator of the heat treatment apparatus 1 to input various commands and parameters to the controller 3. The operator can also set conditions of a treatment recipe describing treatment procedures and treatment conditions of a semiconductor wafer W from the input part 34 while checking display contents of the display part 33. As the display part 33 and the input part 34, a touch panel having functions of both of them can be used. In the present preferred embodiment, a liquid crystal touch panel provided on the outer wall of the heat treatment apparatus 1 is employed.

Besides the aforementioned components, the heat treatment apparatus 1 further includes various cooling structures to prevent an excessive temperature increase in the halogen heating part 4, the flash heating part 5, and the chamber 6 due to heat energy generated by the halogen lamps HL and the flash lamps FL during heat treatment of a semiconductor wafer W. For example, a water cooling tube (not illustrated) is provided in walls of the chamber 6. The halogen heating part 4 and the flash heating part 5 also each have an air cooling structure for forming a gas flow therein to exhaust heat. Then, air is also supplied to a gap between the upper chamber window 63 and the lamp light radiation window 53 to cool down the flash heating part 5 and the upper chamber window 63.

Figure 10:
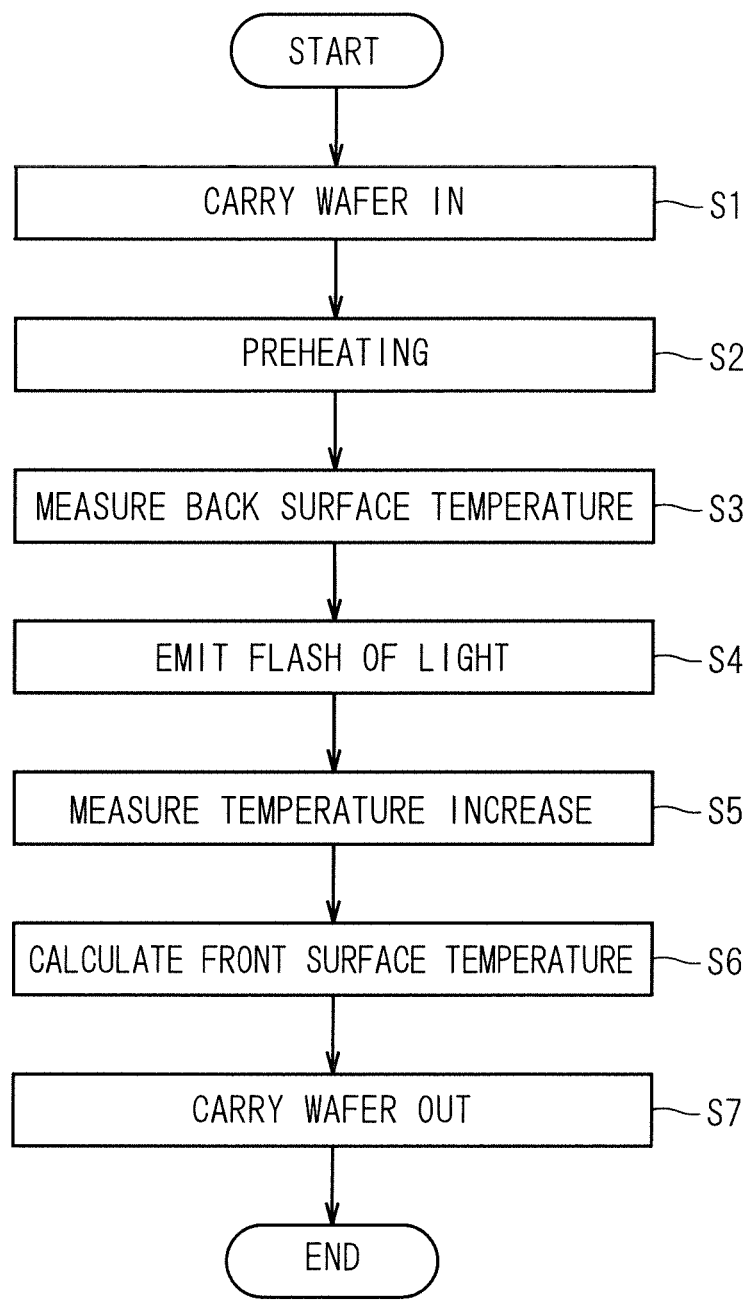
FIG. 10 is a flowchart illustrating a treatment procedure of a semiconductor wafer.

Next, a treatment procedure of a semiconductor wafer W in the heat treatment apparatus 1 will be described. FIG. 10 is a flowchart illustrating the treatment procedure of a semiconductor wafer W. The treatment procedure in the heat treatment apparatus 1 described below proceeds under control of the controller 3 over the operating mechanisms of the heat treatment apparatus 1.

First, the valve 84 is opened for supply of gas and the valves 89 and 192 for exhaust of gas are opened to start the supply and exhaust of gas into and out of the chamber 6. When the valve 84 is opened, nitrogen gas is supplied into the heat treatment space 65 through the gas supply opening 81. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

When the valve 192 is opened, the gas within the chamber 6 is exhausted also through the transport opening 66. In addition, the exhaust mechanism (not illustrated) exhausts also an atmosphere near the drivers of the transfer mechanism 10. When heat treatment is applied to the semiconductor wafer W in the heat treatment apparatus 1, nitrogen gas is continuously supplied into the heat treatment space 65. Then, the amount of the supply is appropriately changed depending on a treatment step.

Subsequently, the gate valve 185 is opened to open the transport opening 66, and then a transport robot outside the heat treatment apparatus 1 transports a semiconductor wafer W to be treated into the heat treatment space 65 of the chamber 6 through the transport opening 66 (step S1). At this time, while there is a risk of sucking an atmosphere outside the heat treatment apparatus 1 into the heat treatment space 65 with transport of the semiconductor wafer W into the heat treatment space 65, the nitrogen gas is continuously supplied into the chamber 6. Thus, the nitrogen gas flows outwardly through the transport opening 66 to enable minimizing sucking of the outside atmosphere into the heat treatment space 65 as described above.

The semiconductor wafer W transported into the heat treatment space 65 by the transport robot is moved forward to a position immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal orientation from below. The semiconductor wafer W is supported by the substrate support pins 77 provided upright on the holding plate 75, and is held by the susceptor 74. The semiconductor wafer W is also held by the holder 7 with the front surface serving as a surface to be treated, facing upward. A predetermined distance is defined between the back surface (a main surface opposite to the front surface) of the semiconductor wafer W supported by the plurality of substrate support pins 77 and the holding surface 75a of the holding plate 75. The pair of transfer arms 11 moved downwardly below the susceptor 74 is moved back to the retracted position, i.e., to the inside of the recessed portion 62, by the horizontal movement mechanism 13.

FIG. 11 is a graph showing change in front surface temperature of a semiconductor wafer W. After the semiconductor wafer W is transported into the chamber 6 and held by the susceptor 74, at time t1, the 40 halogen lamps HL of the halogen heating part 4 are simultaneously turned on to start preheating (assisting heating) (step S2). Halogen light emitted from the halogen lamps HL is transmitted through the lower chamber window 64 and the susceptor 74 both made of quartz, and impinges upon the lower surface of the semiconductor wafer W. Receiving the halogen light emitted from the halogen lamps HL allows the semiconductor wafer W to be preheated, so that the semiconductor wafer W increases in temperature. Then, the transfer arms 11 of the transfer mechanism 10 are retracted to the inside of the recessed portion 62, and thus do not obstruct the heating using the halogen lamps HL.

The lower radiation thermometer 20 measures temperature of the semiconductor wafer W that is increased by light emitted from the halogen lamps HL. Specifically, the lower radiation thermometer 20 receives infrared light emitted from the lower surface (back surface) of the semiconductor wafer W held by the susceptor 74 through the opening 78, the infrared light passing through the transparent window 21, to measure back surface temperature of the semiconductor wafer W (step S3). The lower radiation thermometer 20 may start measuring temperature before the preheating using the halogen lamps HL is started.

Incidentally, a semiconductor wafer W is formed with various kinds of film suitable for a treatment purpose in many cases. For example, a resist film for photomask, an interlayer insulating film, a high dielectric constant film, or the like is formed on a semiconductor wafer W in some cases. While these films are typically formed on the front surface (surface to be treated) of the semiconductor wafer W, some film may be formed on the back surface of the semiconductor wafer W as manufacturing processes of semiconductor devices become more complicated in recent years. Then, the semiconductor wafer W with the film formed on the back surface is subjected to heat treatment in the heat treatment apparatus 1.

When the lower radiation thermometer 20 measures temperature of the back surface of the semiconductor wafer W in a non-contact manner, emissivity of the back surface needs to be set in the lower radiation thermometer 20. When a film is not formed on the back surface of the semiconductor wafer W, the emissivity of silicon being a wafer base material may be set in the lower radiation thermometer 20. However, when a film is formed also on the back surface of the semiconductor wafer W, the emissivity of the back surface also varies depending on the film.

FIG. 12 is a graph showing influence of a formed film on the emissivity. FIG. 12 exemplifies the following cases: where a silicon nitride (SiN) film with a thickness of 1 μm is formed on the back surface of a semiconductor wafer W; where a silicon dioxide ($SiO_2$) film with a thickness of 1 μm is formed on the back surface of a semiconductor wafer W; and where no film is formed on the back surface of a semiconductor wafer W and silicon being a base material is exposed on the back surface. In FIG. 12, the horizontal axis represents a light receiving angle of a radiation thermometer with respect to the semiconductor wafer W, and the vertical axis represents emissivity.

As shown in FIG. 12, when the light receiving angle is relatively small, the emissivity greatly differs depending on the type of film formed on the back surface of the semiconductor wafer W. That is, the emissivity depends on the type of film. On the other hand, when the light receiving angle increases, difference in emissivity depending on the type of film formed on the back surface of the semiconductor wafer W decreases. That is, dependence of the emissivity on the type of film decreases.

In the present preferred embodiment, the lower radiation thermometer 20 has a relatively large light receiving angle θ of 60° or more and 89° or less with respect to the semiconductor wafer W. This reduces the dependence of the emissivity on the back surface of the semiconductor wafer W on the type of film. Thus, when the emissivity of silicon corresponding to the light receiving angle θ is set in the lower radiation thermometer 20, the lower radiation thermometer 20 can accurately measure back surface temperature of the semiconductor wafer W regardless of the type of film formed on the back surface of the semiconductor wafer W.

The back surface temperature of the semiconductor wafer W measured by the lower radiation thermometer 20 is transmitted to the controller 3. The controller 3 controls output from the halogen lamps HL while monitoring whether temperature of the semiconductor wafer W, which increases in temperature with light emitted from the halogen lamps HL, reaches a predetermined preheating temperature T1. In other words, the controller 3 effects feedback control of the output from the halogen lamps HL so that the temperature of the semiconductor wafer W becomes preheating temperature T1, based on the value measured with the lower radiation thermometer 20. As described above, the lower radiation thermometer 20 is also a temperature sensor for controlling the output of the halogen lamps HL in a preheating stage. While the lower radiation thermometer 20 measures the back surface temperature of the semiconductor wafer W, there is no temperature difference between the front and back surfaces of the semiconductor wafer W in the preheating stage using the halogen lamps HL. Thus, the back surface temperature measured by the lower radiation thermometer 20 can be regarded as the temperature of the entire semiconductor wafer W.

After the temperature of the semiconductor wafer W reaches the preheating temperature T1, the controller 3 maintains the temperature of the semiconductor wafer W at the preheating temperature T1 for a short time. Specifically, at time t2 when the temperature of the semiconductor wafer W measured with the lower radiation thermometer 20 reaches the preheating temperature T1, the controller 3 adjusts the output from the halogen lamps HL to maintain the temperature of the semiconductor wafer W at approximately the preheating temperature T1.

When preheating is performed using the halogen lamps HL as described above, the entire semiconductor wafer W is uniformly increased in temperature to the preheating temperature T1. In the preheating stage using the halogen lamps HL, while the semiconductor wafer W tends to decrease in temperature more in its peripheral portion where heat is more liable to dissipate than in its central portion, the halogen lamps HL in the halogen heating part 4 are disposed at a higher density in a region facing the peripheral portion of the semiconductor wafer W than in a region facing the central portion thereof. This causes increasing the amount of light impinging on the peripheral portion of the semiconductor wafer W where heat is liable to dissipate, so that in-plane temperature distribution of the semiconductor wafer W in the preheating stage can be uniform.

At time t3 when a predetermined time elapses after temperature of a semiconductor wafer W held on the susceptor 74 reaches the preheating temperature T1, the flash lamps FL of the flash heating part 5 irradiates the front surface of the semiconductor wafer W with a flash of light (step S4). At this time, a part of the flash of light emitted from the flash lamps FL travels directly toward the interior of the chamber 6, and a part of the remainder of the flash of light travels toward the interior of the chamber 6 after reflected once from the reflector 52. The irradiation of the semiconductor wafer W with the flash of light described above achieves flash heating of the semiconductor wafer W.

The flash heating is performed with a flash of light emitted from the flash lamps FL, so that the front surface temperature of the semiconductor wafer W can be increased in a short time. Specifically, the flash of light emitted from the flash lamps FL is an intense flash of light that is emitted for an extremely short period of time ranging from about 0.1 to about 100 milliseconds, and that is acquired by converting electrostatic energy preliminarily stored in a capacitor into an ultrashort light pulse. Then, the front surface temperature of the semiconductor wafer W rapidly increases in a very short time due to the flash of light emitted from the flash lamps FL.

The front surface temperature of the semiconductor wafer W is monitored by the upper radiation thermometer 25. The upper radiation thermometer 25 measures temperature change of the front surface instead of measuring an absolute temperature of the front surface of the semiconductor wafer W. That is, the upper radiation thermometer 25 measures temperature increase (jump temperature) ΔT of the front surface of the semiconductor wafer W from the preheating temperature T1 at the time of irradiation with a flash of light (step S5). The back surface temperature of the semiconductor wafer W is also measured by the lower radiation thermometer 20 at the time of irradiation with a flash of light. However, when an intense flash of light is emitted in an extremely short time, only the vicinity of the front surface of the semiconductor wafer W is rapidly heated. This causes a temperature difference between the front and back surfaces of the semiconductor wafer W, so that the lower radiation thermometer 20 cannot measure the front surface temperature of the semiconductor wafer W. As with the lower radiation thermometer 20, the upper radiation thermometer 25 also has a light receiving angle of 60° or more and 89° or less with respect to the semiconductor wafer W. Thus, the upper radiation thermometer 25 can accurately measure the temperature increase ΔT of the front surface of the semiconductor wafer W regardless of the type of film formed on the front surface of the semiconductor wafer W.

Next, the temperature calculation unit 31 of the controller 3 calculates a maximum temperature reached by the front surface of the semiconductor wafer W at the time of irradiation with a flash of light (step S6). The back surface temperature of the semiconductor wafer W is continuously measured by the lower radiation thermometer 20 at least from time t2 when the semiconductor wafer W reaches a predetermined temperature during preheating to time t3 when the flash of light is emitted. At the preheating stage before the flash of light is emitted, there is no temperature difference between the front and back surfaces of the semiconductor wafer W, and thus the back surface temperature of the semiconductor wafer W measured by the lower radiation thermometer 20 before the flash of light is emitted is equal to the front surface temperature. The temperature calculation unit 31 adds the temperature increase ΔT of the front surface of the semiconductor wafer W at the time of irradiation with a flash of light, measured by the upper radiation thermometer 25, to the back surface temperature of the semiconductor wafer W (preheating temperature T1) measured by the lower radiation thermometer 20 between the time t2 and the time t3 immediately before the flash of light is emitted, thereby calculating a maximum reached temperature T2 of the front surface. The temperature calculation unit 31 may display the calculated maximum reached temperature T2 on the display part 33.

The lower radiation thermometer 20 has a relatively large light receiving angle θ of 60° or more and 89° or less with respect to the semiconductor wafer W, so that the lower radiation thermometer 20 can accurately measure the back surface temperature of the semiconductor wafer W regardless of the type of film formed on the back surface of the semiconductor wafer W. The maximum reached temperature T2 of the front surface of the semiconductor wafer W at the time of irradiation with a flash of light can be accurately calculated by adding the temperature increase ΔT of the upper surface of the semiconductor wafer W measured by the upper radiation thermometer 25 to the back surface temperature (equal to the front surface temperature) of the semiconductor wafer W measured accurately by the lower radiation thermometer 20.

After the irradiation with a flash of light is finished, the halogen lamps HL are tuned off at time t4 when a predetermined time elapses. This causes the temperature of the semiconductor wafer W to decrease rapidly from the preheating temperature T1. The lower radiation thermometer 20 measures the temperature of the semiconductor wafer W during decrease in temperature, and a result of the measurement is transmitted to the controller 3. The controller 3 monitors whether the temperature of the semiconductor wafer W decreases to a predetermined temperature based on the result of the measurement with the lower radiation thermometer 20. After the temperature of the semiconductor wafer W decreases to the predetermined temperature or below, the pair of transfer arms 11 of the transfer mechanism 10 is moved horizontally again from the retracted position to the transfer operation position and is then moved upwardly. This causes the lift pins 12 to protrude from the upper surface of the susceptor 74 to receive the heat-treated semiconductor wafer W from the susceptor 74. Subsequently, the transport opening 66 having been closed is opened by the gate valve 185, and the transport robot outside the heat treatment apparatus 1 transports the semiconductor wafer W placed on the lift pins 12 from the chamber 6, and then the heating treatment of the semiconductor wafer W is completed (step S7).

In the present preferred embodiment, the lower radiation thermometer 20 is provided obliquely below the semiconductor wafer W held by the susceptor 74, and the lower radiation thermometer 20 has a relatively large light receiving angle θ of 60° or more and 89° or less with respect to the semiconductor wafer W. Thus, the emissivity of the back surface of the semiconductor wafer W has low dependence on the type of film, so that the lower radiation thermometer 20 can measure accurately the back surface temperature of the semiconductor wafer W regardless of the type of film formed on the back surface of the semiconductor wafer W.

In addition, the upper radiation thermometer 25 is provided obliquely above the semiconductor wafer W held by the susceptor 74, and the upper radiation thermometer 25 also has a light receiving angle of 60° or more and 89° or less with respect to the semiconductor wafer W. Thus, the upper radiation thermometer 25 can measure accurately the temperature increase ΔT of the front surface of the semiconductor wafer W regardless of the type of film formed on the front surface of the semiconductor wafer W.

The lower radiation thermometer 20 measures the back surface temperature of the semiconductor wafer W from time t2 to time t3 immediately before the flash of light is emitted. At the time of irradiation with a flash of light, the upper radiation thermometer 25 measures the temperature increase ΔT of the front surface of the semiconductor wafer W. The front surface temperature of the semiconductor wafer W at the time of irradiation with a flash of light can be accurately calculated by adding the temperature increase ΔT of the front surface of the semiconductor wafer W measured by the upper radiation thermometer 25 to the back surface temperature of the semiconductor wafer W measured accurately by the lower radiation thermometer 20.

While the preferred embodiments according to the present invention are described above, various modifications of the present invention in addition to those described above may be made without departing from the scope and spirit of the present invention. For example, while the 30 flash lamps FL are provided in the flash heating part 5 according to the preferred embodiment described above, the present invention is not limited to this. Any number of flash lamps FL may be provided. The flash lamps FL are not limited to the xenon flash lamps, but may be krypton flash lamps. In addition, the number of halogen lamps HL provided in the halogen heating part 4 is not limited to 40. Any number of halogen lamps HL may be provided.

In the preferred embodiment described above, the filament-type halogen lamps HL are used as continuous lighting lamps that emit light continuously for one second or more to preheat the semiconductor wafer W. The present invention, however, is not limited to this. In place of the halogen lamps HL, discharge type arc lamps (e.g., xenon arc lamps) may be used as the continuous lighting lamps to perform the preheating.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for irradiating a substrate having a back surface formed with a film with a flash of light to heat the substrate, the heat treatment method comprising the following steps:
   (a) preheating said substrate by irradiating said substrate with light from a continuous lighting lamp;
   (b) irradiating a front surface of said preheated substrate with a flash of light from a flash lamp to heat said substrate by flash heating;
   (c) measuring continuously temperature of the back surface of said substrate with a first radiation thermometer provided obliquely below said substrate when said step (a) and said step (b) are performed;
   (d) measuring a temperature increase of the front surface of said substrate at the time of irradiation with a flash of light with a second radiation thermometer provided obliquely above said substrate when said step (b) is performed; and
   (e) calculating front surface temperature of said substrate by adding the temperature increase of the front surface of said substrate at the time of irradiation with a flash of light measured with said second radiation thermometer to the temperature of the back surface of said substrate measured with said first radiation thermometer during a period of time from when said preheated substrate has a temperature reaching a predetermined temperature to when the flash of light is emitted.

2. The heat treatment method according to claim 1, wherein
said first radiation thermometer has a light receiving angle of 60° or more and 89° or less with respect to said substrate.

* * * * *